United States Patent
Chang et al.

(10) Patent No.: US 10,867,794 B2
(45) Date of Patent: Dec. 15, 2020

(54) PATTERNING METHOD FOR SEMICONDUCTOR DEVICES AND STRUCTURES RESULTING THEREFROM

(71) Applicant: Taiwan Semiconductor Manufacturing Company, Ltd., Hsinchu (TW)

(72) Inventors: Ching-Yu Chang, Taipei (TW); Jung-Hau Shiu, New Taipei (TW); Szu-Ping Tung, Taipei (TW); Chun-Kai Chen, Kaohsiung (TW); Jen Hung Wang, Hsinchu (TW); Tze-Liang Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/369,501

(22) Filed: Mar. 29, 2019

(65) Prior Publication Data
US 2020/0312662 A1   Oct. 1, 2020

(51) Int. Cl.
*H01L 21/033* (2006.01)
*H01L 21/311* (2006.01)
*H01L 21/027* (2006.01)

(52) U.S. Cl.
CPC ...... *H01L 21/0337* (2013.01); *H01L 21/0276* (2013.01); *H01L 21/0332* (2013.01)

(58) Field of Classification Search
None
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2007/0264828 A1* | 11/2007 | Jung | H01L 21/0337 438/692 |

(Continued)

*Primary Examiner* — Shamim Ahmed
(74) *Attorney, Agent, or Firm* — Slater Matsil, LLP

(57) ABSTRACT

A hard mask formed over a patterned photoresist layer in a tri-layer photoresist and a method for patterning a target layer using the same are disclosed. In an embodiment, a method includes depositing a photoresist layer over a first hard mask layer; patterning the photoresist layer to form a plurality of openings in the photoresist layer; depositing a second hard mask layer over the photoresist layer, the second hard mask layer filling the plurality of openings, the second hard mask layer having a first etch selectivity relative to the first hard mask layer, the photoresist layer having a second etch selectivity relative to the first hard mask layer, the first etch selectivity being greater than the second etch selectivity; planarizing the second hard mask layer; removing the photoresist layer; and etching the first hard mask layer using the second hard mask layer as a mask.

20 Claims, 18 Drawing Sheets

(56) References Cited

U.S. PATENT DOCUMENTS

| | | | |
|---|---|---|---|
| 2009/0181330 A1* | 7/2009 | Gabor | G03F 7/70433 430/322 |
| 2015/0243520 A1* | 8/2015 | Park | H01L 21/0273 438/703 |
| 2015/0311075 A1* | 10/2015 | Huang | H01L 21/0337 438/702 |
| 2019/0385902 A1* | 12/2019 | Wang | H01L 21/31144 |

* cited by examiner

PATTERNING METHOD FOR SEMICONDUCTOR DEVICES AND STRUCTURES RESULTING THEREFROM

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
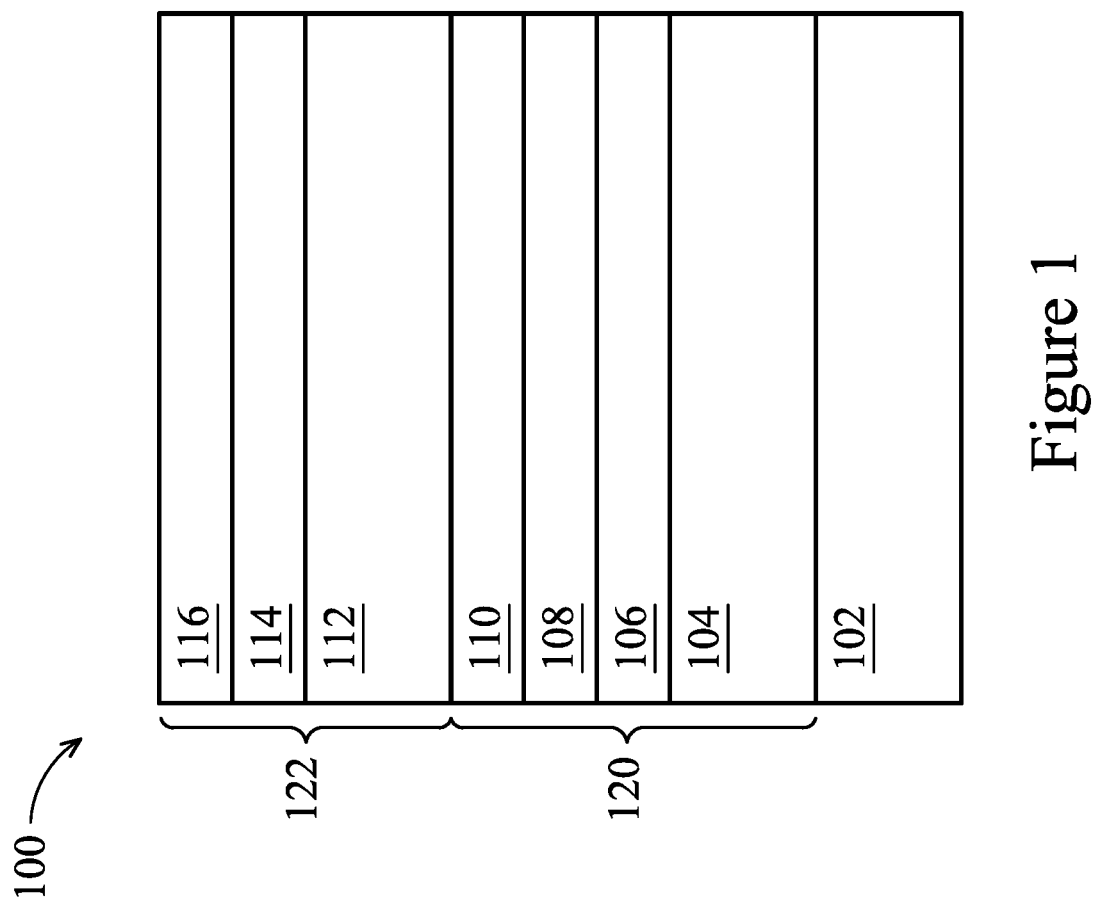
FIGS. 1 through 12 illustrate cross-sectional views of intermediary stages of manufacturing a semiconductor device in accordance with a first group of embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for improved patterning of photoresists. For example, a tri-layer photoresist including a bottom anti-reflective coating (BARC) layer, a first hard mask layer, and a photoresist layer may be formed. The photoresist layer may be exposed to an energy source (e.g., an extreme ultraviolet (EUV) light source) and developed to form openings in the photoresist layer. A second hard mask layer may be formed in the openings and over the remaining portions of the photoresist layer by a process such as atomic layer deposition (ALD), chemical vapor deposition (CVD), a combination thereof, or the like. The second hard mask may then be planarized and the remaining portions of the photoresist layer removed. Although the embodiments discussed below are directed to a single-patterning and single-etching (1P1E) process, features of the disclosed embodiments may be used for self-aligned double-patterning (SADP) processes, self-aligned quadruple-patterning (SAQP) processes, and any other patterning processes.

The second hard mask layer may be formed of a material having a greater etch selectivity relative to the first hard mask layer than the photoresist layer. Compared to typical photolithographic processes, which do not include a second hard mask layer formed over the patterned photoresist layer, using the second hard mask layer prevents scum (e.g., excess material remaining after etching the photoresist layer) and line bridging (caused by, e.g., excess material of the photoresist layer being etched), aids in reducing device feature critical dimensions, reduces line width roughness, increases the etching window, and results in fewer defects in a target layer underlying the tri-layer photoresist. Thus, fine pitched semiconductor structures can be manufactured with improved yield.

FIGS. 1 through 12 illustrate cross-sectional views of intermediate stages in the formation of features in a target layer 104 on a semiconductor device 100, in accordance with some exemplary embodiments. The target layer 104 is a layer in which a plurality of patterns is to be formed in accordance with embodiments of the present disclosure. In some embodiments, the semiconductor device 100 is processed as part of a larger wafer. In such embodiments, after various features of the semiconductor device 100 are formed (e.g., active devices, interconnect structures, and the like), a singulation process may be applied to scribe line regions of the wafer in order to separate individual semiconductor dies from the wafer (also referred to as singulation).

In some embodiments, the target layer 104 is an inter-metal dielectric (IMD) layer. In such embodiments, the target layer 104 comprises a low-k dielectric material having a dielectric constant (k value) lower than 3.8, lower than about 3.0, or lower than about 2.5, for example. In alternative embodiments, the target layer 103 is an IMD layer comprising high-k dielectric material having a k value higher than 3.8. Openings may be patterned in the target layer 104 with the embodiment processes, and conductive lines and/or vias may be formed in the openings as described below.

In some embodiments, the target layer 104 is a semiconductor substrate. The semiconductor substrate may be formed of a semiconductor material such as silicon, silicon germanium, or the like. In some embodiments, the semiconductor substrate is a crystalline semiconductor substrate such as a crystalline silicon substrate, a crystalline silicon carbon substrate, a crystalline silicon germanium substrate, a III-V compound semiconductor substrate, or the like. The semiconductor substrate may be patterned with an embodiment process, and subsequent process steps may be used to form shallow trench isolation (STI) regions in the substrate. Semiconductor fins may protrude from between the formed STI regions. Source/drain regions may be formed in the semiconductor fins, and gate dielectric and electrode layers may be formed over channels regions of the fins, thereby forming semiconductor devices such as fin field effect transistors (FinFETs).

In some embodiments, the target layer 104 is a conductive layer, such as, a metal layer or a polysilicon layer, which is blanket deposited. Embodiment patterning processes may be applied to the target layer 104 in order to pattern metal gates (e.g., in a cut metal gate process) and/or dummy gates of FinFETs. By using the embodiment processes to pattern a conductive target layer 104, spacing between adjacent gates may be reduced and gate density may be increased.

In FIG. 1, a film stack 120 including the target layer 104 is formed in the semiconductor device 100. In some embodiments, the target layer 104 may be formed over a semiconductor substrate 102. The semiconductor substrate 102 may be formed of a semiconductor material such as silicon, doped or undoped, or an active layer of a semiconductor-on-insulator (SOI) substrate. The semiconductor substrate 102 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof; or the like. Other substrates, such as multi-layered or gradient substrates, may also be used. Devices, such as transistors, diodes, capacitors, resistors, and the like, may be formed in and/or on an active surface of the semiconductor substrate 102. In other embodiments, where the target layer 104 is a semiconductor substrate used to form fin field-effect transistors (FinFETs), the semiconductor substrate 102 may be omitted.

Although FIG. 1 illustrates the target layer 104 as being in physical contact with the semiconductor substrate 102, any number of intervening layers may be disposed between the target layer 104 and the semiconductor substrate 102. Such intervening layers may include an inter-layer dielectric (ILD) layer comprising a low-k dielectric and having contact plugs formed therein, other inter-metallic dielectric (IMD) layers having conductive lines and/or vias formed therein, one or more intermediary layers (e.g., etch stop layers, adhesion layers, or the like), combinations thereof, and the like. For example, an optional etch stop layer may be disposed directly under the target layer 104. The etch stop layer may act as a stop for an etching process subsequently performed on the target layer 104 (e.g., the etching process described below with respect to FIG. 12). The material and process used to form the etch stop layer may depend on the material of the target layer 104. In some embodiments, the etch stop layer may be formed of silicon nitride, SiON, SiCON, SiC, SiOC, $SiC_xN_y$, $SiO_x$, other dielectrics, combinations thereof, or the like, and may be formed by plasma-enhanced chemical vapor deposition (PECVD), low-pressure CVD (LPCVD), physical vapor deposition (PVD), or the like.

The film stack 120 further includes an optional dielectric layer 106 formed over the target layer 104. The dielectric layer 106 may be an anti-reflective coating (ARC), which may aid in the exposure and focus of overlying photoresist layers (discussed below) during patterning of the overlying photoresist layers. In some embodiments, the dielectric layer 106 may be formed from SiON, silicon carbide, materials doped with oxygen (O) and/or nitrogen (N), or the like. In some embodiments, the dielectric layer 106 is substantially free from nitrogen, and may be formed from an oxide. In such embodiments, the dielectric layer 106 may be also referred to as a nitrogen-free ARC (NFARC). A material composition of the dielectric layer 106 may be selected to prevent reflection in some embodiments. The dielectric layer 106 may be formed by PECVD, high-density plasma (HDP) deposition, or the like. The dielectric layer 106 is an optional layer and may be excluded, for example, in embodiments where a hard mask layer 108 (described below) can be selectively etched relative to the target layer 104.

The film stack 120 further includes a hard mask layer 108 formed over the dielectric layer 106 and the target layer 104. The hard mask layer 108 may be formed of a material that comprises a metal (e.g., titanium nitride, titanium, tantalum nitride, tantalum, a metal-doped carbide (e.g., tungsten carbide), or the like); a metalloid (e.g., silicon nitride, boron nitride, silicon carbide, or the like); an oxide (e.g., tetraethylorthosilicate (TEOS) or the like); silicon, or the like. In some embodiments, a material composition of the hard mask layer 108 may be determined to provide a high etch selectivity with an underlying layer, for example with respect to the dielectric layer 106 and/or the target layer 104. The hard mask layer 108 may be formed by PVD, radio frequency PVD (RFPVD), atomic layer deposition (ALD), or the like. In subsequent processing steps, a pattern is formed on the hard mask layer 108 using an embodiment patterning process. The hard mask layer 108 is then used as an etching mask for etching the target layer 104, where the pattern of the hard mask layer 108 is transferred to the target layer 104.

The film stack 120 may further include a dielectric layer 110 formed over the hard mask layer 108. The dielectric layer 110 may be formed from a silicon oxide material, such as borophosphosilicate tetraethylorthosilicate (BPTEOS), undoped tetraethylorthosilicate (TEOS) oxide, or the like, and may be formed by CVD, ALD, PEALD, spin-on coating, or the like. Other processes and materials may be used. In some embodiments, the dielectric layer 110 also acts as an anti-reflective coating. The hard mask layer 108 and the dielectric layer 110 may have different material compositions such that the hard mask layer 108 and the dielectric layer 110 can each be selectively etched. Although FIG. 1 illustrates the dielectric layer 110 as being disposed above the hard mask layer 108, in other embodiments, the dielectric layer 110 may be disposed under the hard mask layer 108.

A tri-layer photoresist 122 is formed on the film stack 120 over the dielectric layer 110. The tri-layer photoresist 122 includes a bottom layer 112, a middle layer 114 over the bottom layer 112, and an upper layer 116 over the middle layer 114. The bottom layer 112 and the upper layer 116 may be formed of photoresist material (e.g., photosensitive materials), which include organic materials. The upper layer 116 may comprise a polymer material. In some embodiments, the bottom layer 112 may also be a bottom anti-reflective coating (BARC) layer. The middle layer 114 may comprise an inorganic material, which may be a nitride (such as silicon nitride), an oxynitride (such as silicon oxynitride), an oxide (such as silicon oxide), or the like. The middle layer 114 may be formed of a material having a high etching selectivity relative to the upper layer 116 and the bottom layer 112. The various layers of the tri-layer photoresist 122 may be blanket deposited sequentially using, for example, spin-on processes, chemical vapor deposition (CVD), atomic layer deposition (ALD), combinations thereof, or the like. Although a tri-layer photoresist 122 is discussed herein, in other embodiments, the photoresist 122 may be a monolayer or a bilayer (e.g., comprising only the bottom layer 112 and the upper layer 116 without the middle layer 114) photoresist. The type of photoresist used (e.g., monolayer, bilayer, or tri-layer) may depend on the photolithography process used to pattern various layers of the underlying film stack 120. For example, in advanced extreme ultraviolet (EUV) lithography processes, a monolayer or bilayer photoresist 122 may be used.

Photoresist layers having a high aspect ratio of height to width of subsequently patterned openings (such as openings 130 formed in the upper layer 116 and discussed below with respect to FIG. 2) may be susceptible to photoresist collapse. In order to avoid photoresist collapse in the upper layer 116, the thickness of the upper layer 116 may be as thin as possible. For example, the upper layer 116 may have a thickness of less than about 600 Å (60 nm), from about 100 Å to about 600 Å, or the like. However, a thin photoresist decreases the etching window, resulting in the risk of pattern bridging. To avoid pattern bridging and decreasing the etching window, a hard mask (e.g., the hard mask 132 discussed below with respect to FIGS. 3-5) may be formed over the upper layer 116 after patterning the upper layer 116.

Figure 2:
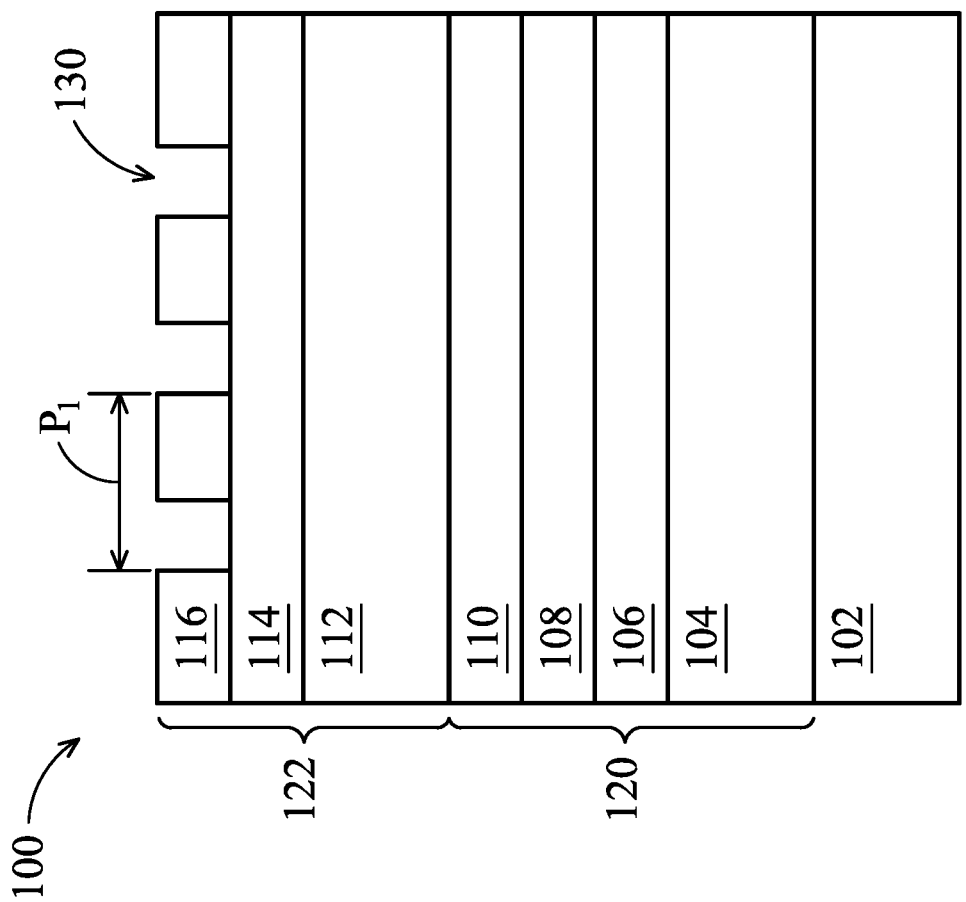

In FIG. 2, the upper layer 116 is patterned using a photolithographic process. The upper layer 116 may be patterned using any suitable photolithography process to form openings 130 therein. As an example of patterning the openings 130 in the upper layer 116, a photomask may be disposed over the upper layer 116. The upper layer 116 may then be exposed to a radiation beam including an extreme ultraviolet (EUV) light source, an ultraviolet (UV) light source, an excimer laser such as a 248 nm beam from a krypton fluoride (KrF) excimer laser, a 193 nm beam from an argon fluoride (ArF) excimer laser, or a 157 nm beam from a $F_2$ excimer laser, or the like while the photomask masks areas of the upper layer 116. Exposure of the upper layer 116 may be performed using an immersion lithography system to increase the resolution and decrease the minimum achievable pitch. A bake or cure operation may be performed to harden the upper layer 116, and a developer may be used to remove either the exposed or unexposed portions of the upper layer 116, depending on whether a positive or negative resist is used. A pitch $P_1$ of the openings 130 may be about 80 nm or less, about 28 nm or less, or even about 20 nm or less. Other pitches $P_1$ of the openings 130 are also contemplated. In some embodiments, the openings 130 may have an aspect ratio of height to width from about 0.25 to about 6, such as about 3. A width of the openings 130 may be from about 10 nm to about 40 nm, such as about 14 nm.

Figure 3:
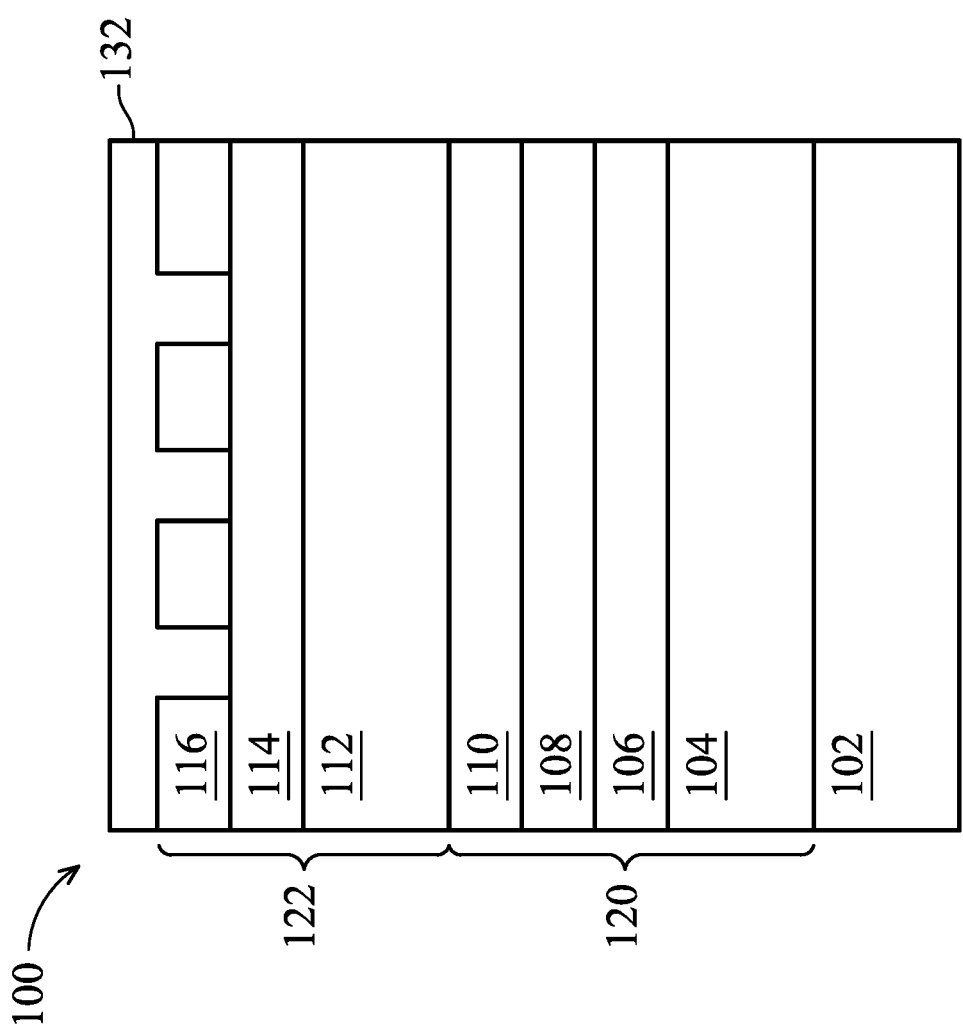

In FIG. 3, a hard mask 132 is deposited in the openings 130 and over the upper layer 116. The hard mask 132 may be deposited using any suitable deposition process, such as atomic layer deposition (ALD), chemical vapor deposition (CVD), or the like. The hard mask 132 may be deposited over the tri-layer photoresist 122 by a deposition chamber, such that additional deposition tools or chambers are not required. The hard mask 132 may have a thickness from about 120 Å to about 1000 Å, such as about 350 Å.

The hard mask 132 may be aluminum oxide ($AlO_x$), titanium oxide ($TiO_x$), zirconium oxide ($ZrO_x$), zinc oxide (ZnO), tin oxide ($SnO_x$), silicon nitride, silicon carbide, silicon carbon nitride, combinations or multiple layers thereof, or the like. In embodiments in which the hard mask 132 is deposited by ALD, the hard mask 132 may be deposited using a first precursor gas and a second precursor gas. The first precursor gas and the second precursor gas are introduced to a reaction chamber and react with the surface of the underlying material one at a time in a sequential, self-limiting manner. As a result, in embodiments in which ALD is used to deposit the hard mask 132, the hard mask 132 is deposited monolayer-by-monolayer. The first precursor gas may include trimethylaluminum (TMA, $Al(CH_3)_3$), diethyl zinc (DEZ, $Zn(C_2H_5)_2$), tetrakis(dimethylamino)titanium (TDMAT, $Ti[(CH_3)_2N]_4$), titanium isopropoxide (TTIP, $Ti[(CH_3)_2OCH]_4$), titanium tetrachloride ($TiCl_4$), bis(tertiary-butyl-amino)silane (BTBAS, $[NH(C_4H_9)]_2SiH_2$), bis(diethylamino)silane (BDIS, $SiH_2[N(C_2H_5)_2]_2$), tris(dimethylamino)silane (3DMAS, $SiH[N(CH_3)_2]_3$), tetrakis(dimethylamido)zirconium (TDMAZ, $Zr[N(CH_3)_2]_4$), zirconium tetrachloride ($ZrCl_4$), tetrakis(dimethylamido)tin (TDMASn, $Sn[N(C_2H_5)_4]$), or the like. The second precursor gas may include an oxygen source (e.g., water ($H_2O$), oxygen ($O_2$), ozone ($O_3$), hydrogen peroxide ($H_2O_2$), nitrous oxide ($N_2O$), or the like), another reacting compound (e.g., nitrogen ($N_2$), ammonia ($NH_3$), or the like), combinations thereof, or the like.

The hard mask 132 may be deposited at a temperature of less than about 200° C., a temperature of from about 50° C. to about 200° C., or the like. Depositing the hard mask 132 at a low temperature, such as below about 200° C. may limit any damage or decomposition of the underlying upper layer 116.

Figure 4:
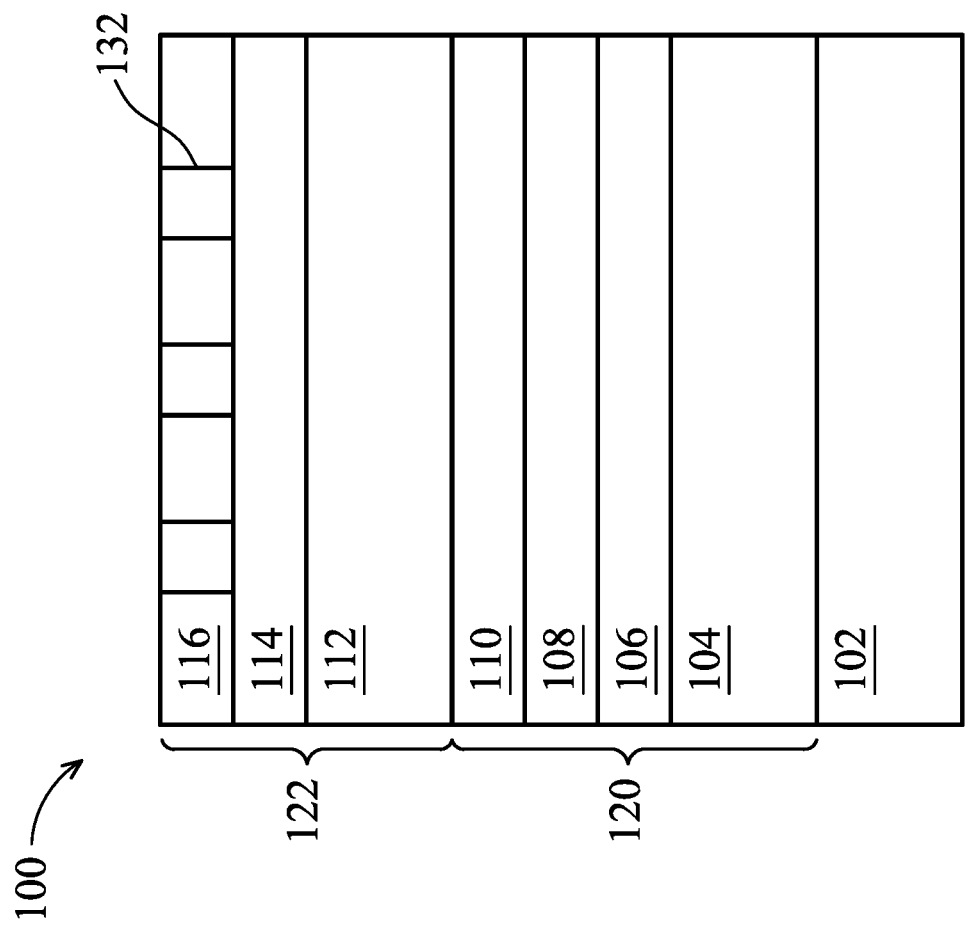

In FIG. 4, a planarization process is performed to level top surfaces of the hard mask 132 with top surfaces of the upper layer 116. The planarization process may be a chemical mechanical polish (CMP), an etch-back process, combinations thereof, or the like. Although top surfaces of the hard mask 132 are illustrated as being level with top surfaces of the upper layer 116 in FIG. 4, in some embodiments (e.g., embodiments in which an etch-back process or the like is used), the top surfaces of the hard mask 132 may be disposed above or below top surfaces of the upper layer 116.

Figure 5:
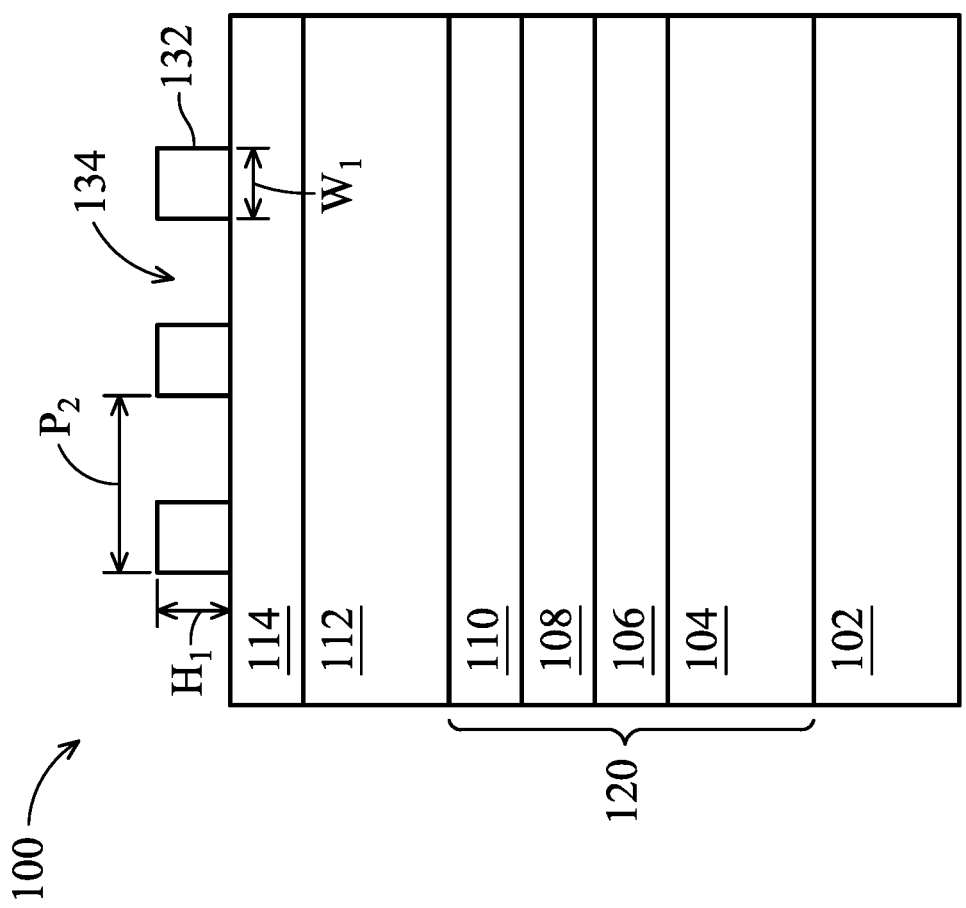

In FIG. 5, the upper layer 116 is removed, thereby forming openings 134 between portions of the hard mask 132. The upper layer 116 may be removed by using an acceptable ashing or stripping process, such as an oxygen plasma ashing, or the like. In some embodiments, the upper layer 116 may be removed by an etch process, such as an anisotropic etch process, an isotropic etch process, or the like. For example, the upper layer 116 may be removed by a wet etch process, a dry etch process, or the like. The upper layer 116 may be formed of a material having high etch selectivity to the hard mask 132 and the middle layer 114. As such, the upper layer is removed without removing the hard mask 132 and the middle layer 114.

After removing the upper layer 116, the remaining portions of the hard mask 132 may have a pitch $P_2$ from about 20 nm to about 80 nm, such as about 28 nm. The remaining portions of the hard mask 132 may have a width $W_1$ from about 10 nm to about 40 nm, such as about 14 nm. The remaining portions of the hard mask 132 may have a height $H_1$ from about 9 nm to about 59 nm, such as about 33 nm.

The hard mask 132 may be formed of a material having a higher etch selectivity to the material of the middle layer 114 than the material of the upper layer 116 has to the material of the middle layer 114. As such, the process used to remove the upper layer 116 may be carried out for a sufficient duration to remove scum (e.g., excess material remaining after patterning the upper layer 116), without damaging the hard mask 132, and without requiring an additional de-scum or trimming process. The additional de-scum or trimming processes may cause line bridging (caused by, e.g., excess material of the mask layer being etched). Forming the hard mask 132 over the upper layer 116 further aids in reducing device feature critical dimensions, reduces line width roughness, increases the etching window, and results in fewer defects in the middle layer 114. These improvements are carried through to a target layer (e.g., the target layer 104) and help to form fine-pitched semiconductor structures with improved yield.

Figure 6:
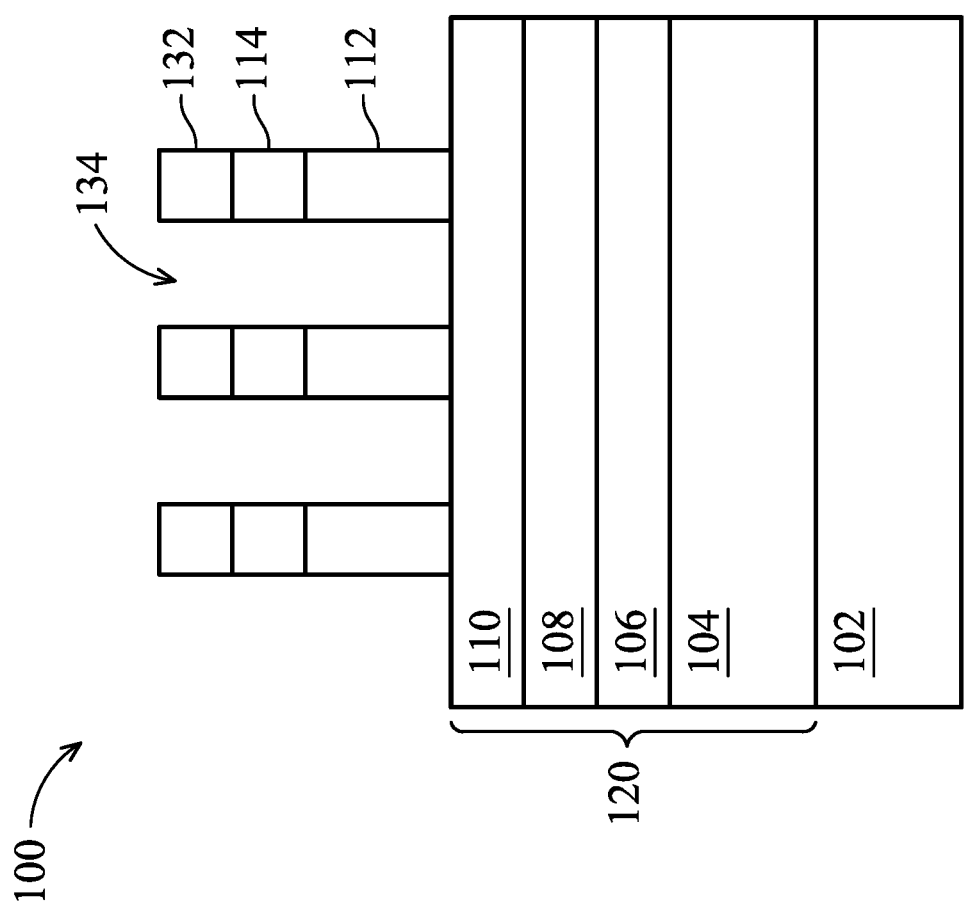

In FIG. 6, an etching process is performed to transfer the pattern of the hard mask 132 to the middle layer 114 and the bottom layer 112, thereby extending the openings 134 through the middle layer 114 and the bottom layer 112. The etching process of the middle layer 114 and the bottom layer 112 is anisotropic, so that the openings 134 in the hard mask 132 are extended through the middle layer 114 and the bottom layer 112 and have about the same sizes in the middle layer 114 and the bottom layer 112 as they do in the hard mask 132. In some embodiments, the hard mask 132 may be consumed as part of etching the middle layer 114 and/or the bottom layer 112. In other embodiments, the hard mask 132 may remain after etching the middle layer 114 and the bottom layer 112.

Figure 7:
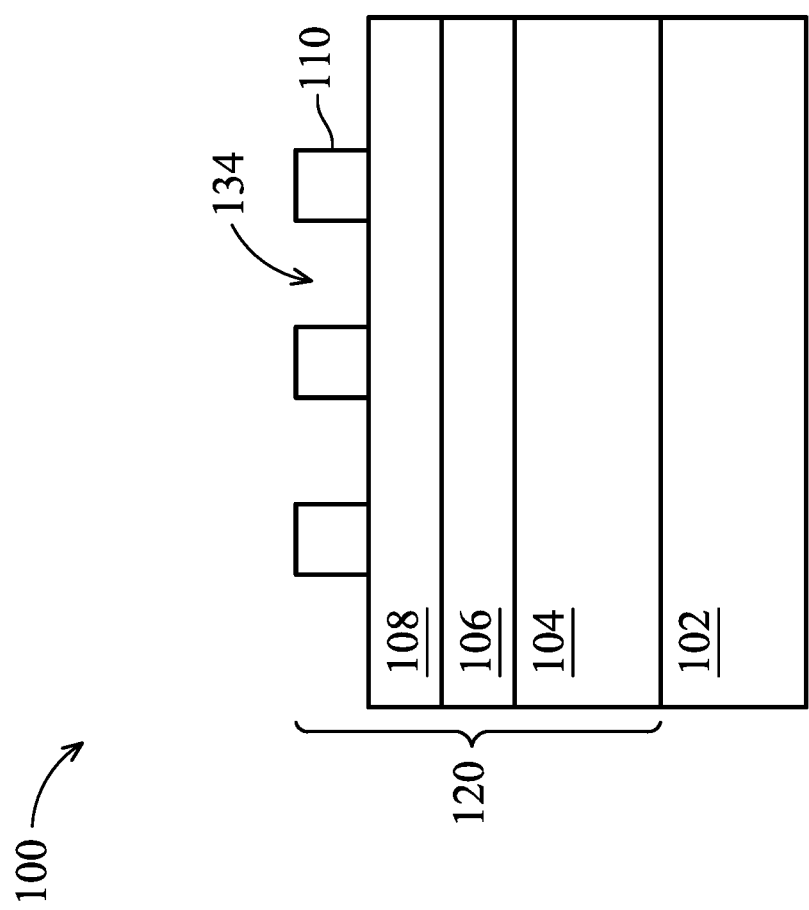

In FIG. 7, an etching process is performed to transfer the pattern of the hard mask 132, the middle layer 114, and the bottom layer 112 to the dielectric layer 110, thereby extending the openings 134 through the dielectric layer 110. The etching process of the dielectric layer 110 is anisotropic, so that the openings 134 in the hard mask 132, the middle layer 114, and the bottom layer 112 are extended through the dielectric layer 110 and have about the same sizes in the dielectric layer 110 as they do in the hard mask 132, the middle layer 114, and the bottom layer 112. As part of etching the dielectric layer 110, the hard mask 132, the middle layer 114, and the bottom layer 112 may be consumed, or at least partially consumed.

In some embodiments in which any of the hard mask 132, the middle layer 114, and/or the bottom layer 112 are not completely consumed while etching the dielectric layer 110, a stripping process (e.g., a wet stripping process), an ashing process (e.g., a plasma ashing process), or the like may be performed to remove remaining portions of the hard mask 132, the middle layer 114, and the bottom layer 112. The ashing process may comprise an oxygen plasma strip, which exposes the dielectric layer 110 to oxygen plasma. The dielectric layer 110 may be formed of a material that is resistant to oxidation, such that the dielectric layer 110 may be maintained throughout the photoresist removal process.

Figure 8:
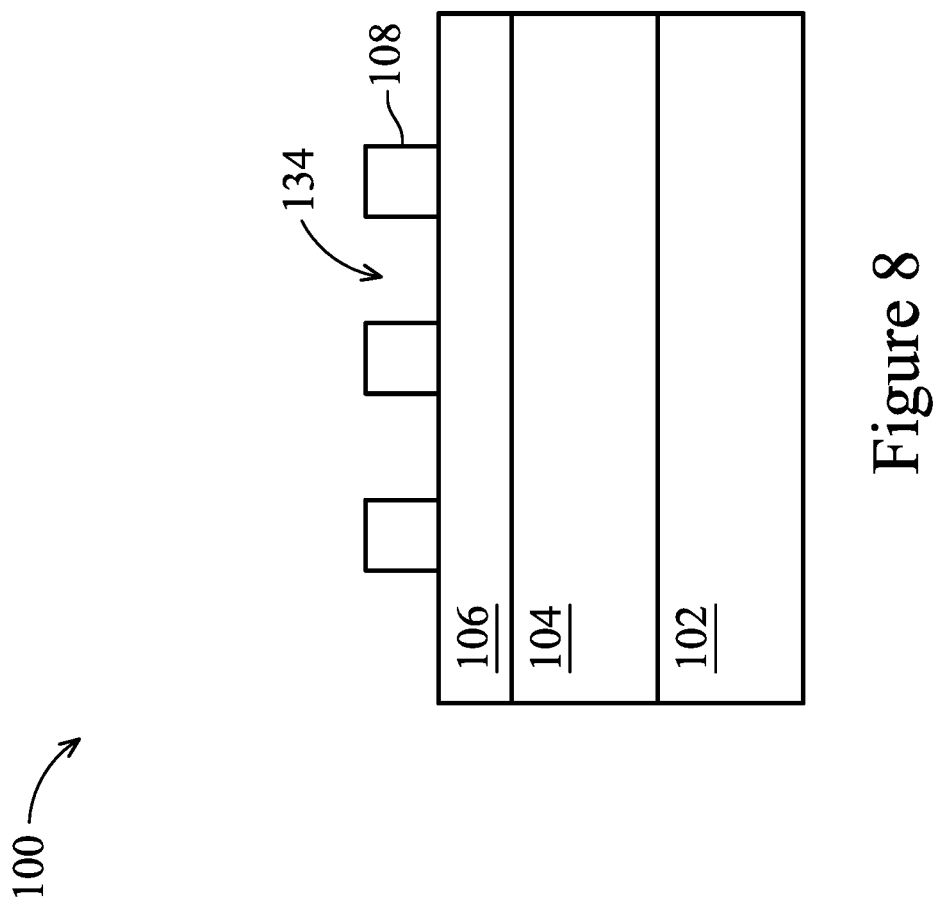

In FIG. 8, an etching process is performed to transfer the pattern of the dielectric layer 110 to the hard mask layer 108, thereby extending the openings 134 through the hard mask layer 108. The etching process of the hard mask layer 108 is anisotropic, so that the openings 134 in the dielectric layer 110 are extended through the hard mask layer 108 and have about the same sizes in the hard mask layer 108 as they do in the dielectric layer 110. As part of etching the hard mask layer 108, the dielectric layer 110 may be consumed. In embodiments in which the dielectric layer 110 is only partially consumed, a wet cleaning process may be performed after patterning the hard mask layer 108 to remove any remaining portions of the dielectric layer 110, as shown in FIG. 8. In still further embodiments, remaining portions of the dielectric layer 110 may be consumed or removed by subsequent patterning steps or wet cleaning processes, respectively.

Figure 9:
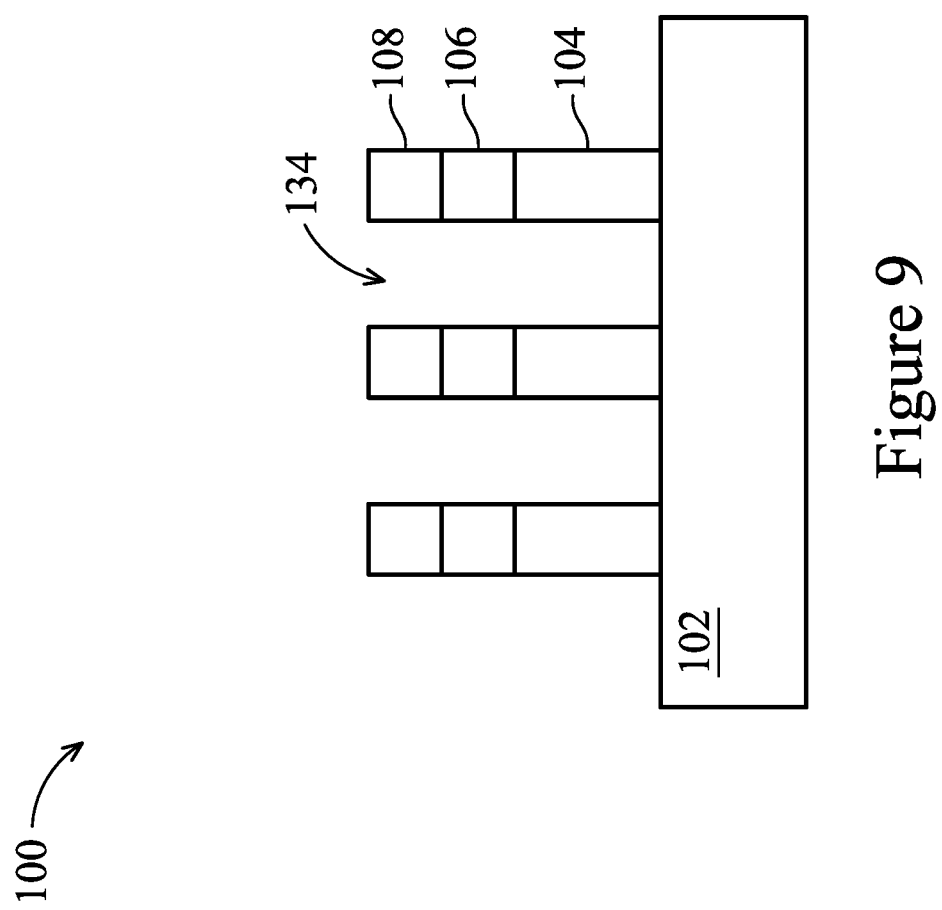
Figure 10:
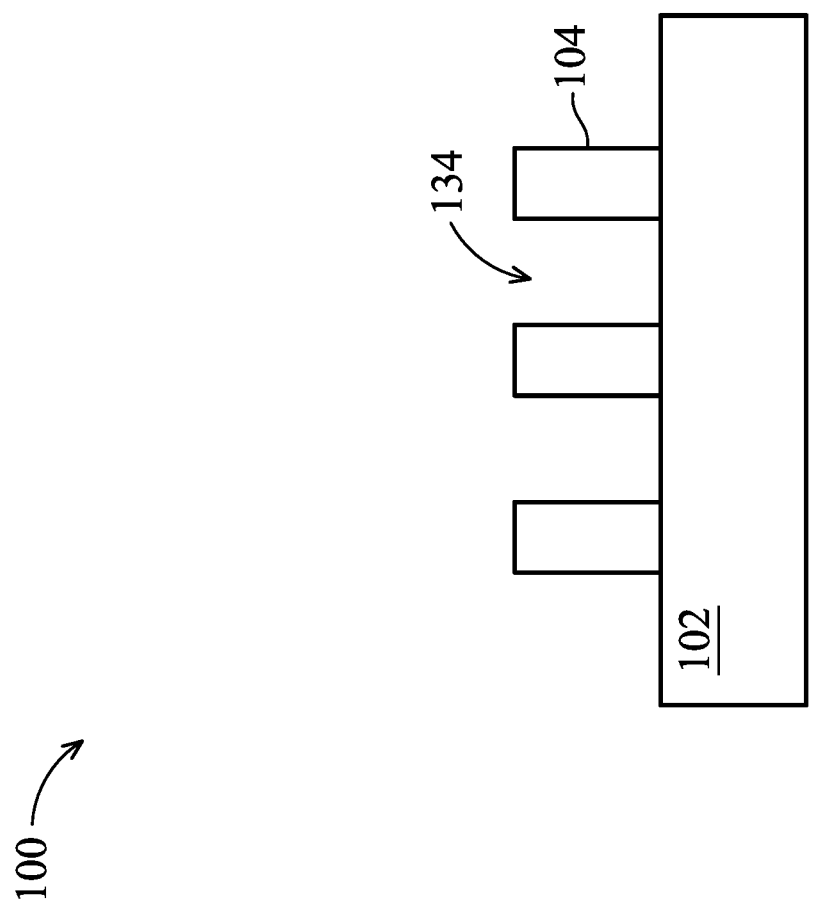

In FIG. 9, an etching process is performed to transfer the pattern of the hard mask layer 108 to the dielectric layer 106 and the target layer 104, thereby extending the openings 134 through the dielectric layer 106 and the target layer 104. The etching process may include anisotropic dry etch processes and/or wet etch processes, which sequentially etch through the dielectric layer 106 to the target layer 104. The target layer 104 may be patterned in a single patterning step. After the openings 134 are patterned through the target layer 104, a wet cleaning process may be performed to remove any remaining portions of the hard mask layer 108 and the dielectric layer 106. The resulting structure is shown in FIG. 10. After the openings 134 are patterned in the target layer 104, features may be formed in the openings 134.

Figure 11:
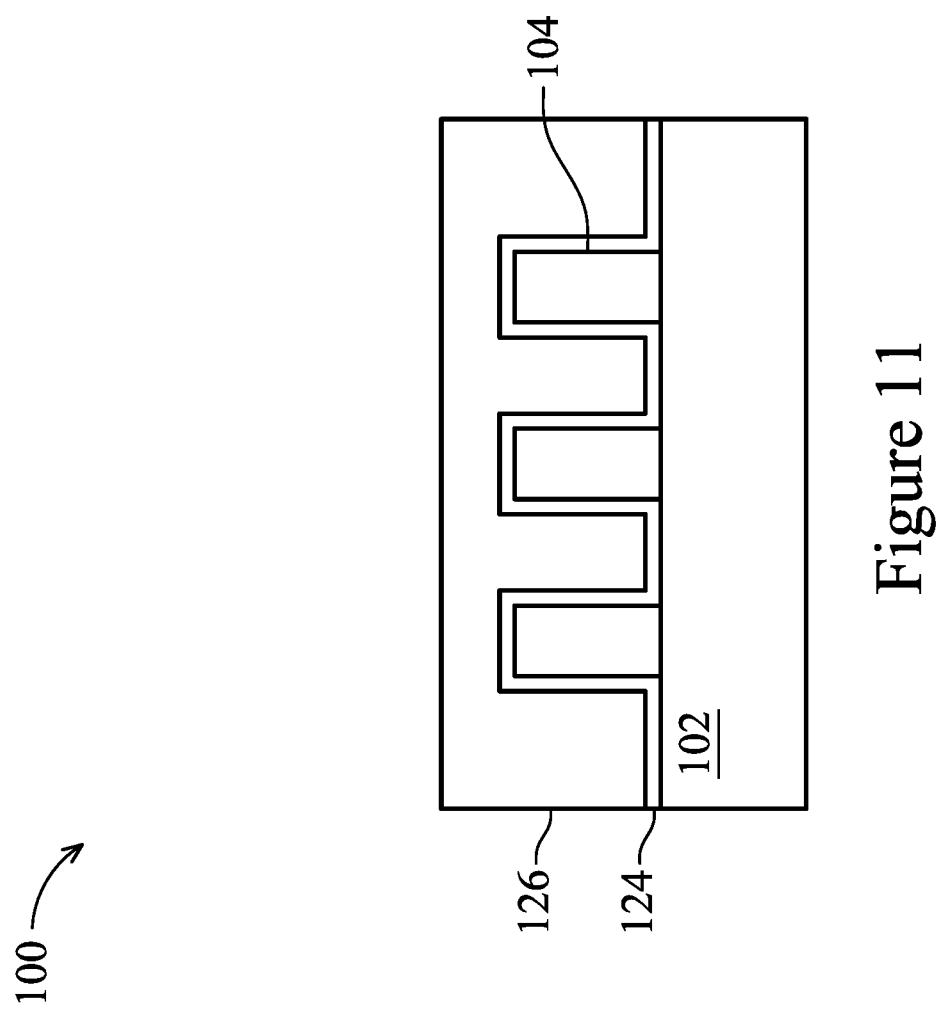

In FIG. 11, conductive features 128 (illustrated in FIG. 12) are formed by initially depositing a liner 124 and a conductive material 126 over the semiconductor substrate 102 and the target layer 104 and filling the openings 134. In an embodiment in which the target layer 104 is a low-k dielectric, the patterned target layer 104 provides an IMD for an interconnect structure. The liner 124 may include one or more layers deposited along sidewalls and a bottom surface of the openings 134 and along top surfaces of the target layer 104. The liner 124 may comprise TiO, TiN, TaO, TaN, multiple layers thereof, or the like and may provide a diffusion barrier, an adhesion layer, and/or seed layers for the conductive features 128. The liner 124 may be deposited using any suitable process, such as, PVD, CVD, ALD, or the like.

After the liner 124 is deposited, remaining portions of the openings 134 may be filled with a conductive material 126, such as copper. The conductive material 126 may be deposited using any suitable method, such as PVD, plating, or the like. As illustrated in FIG. 11, the conductive material 126 may be initially deposited to overfill the openings 134.

Figure 12:
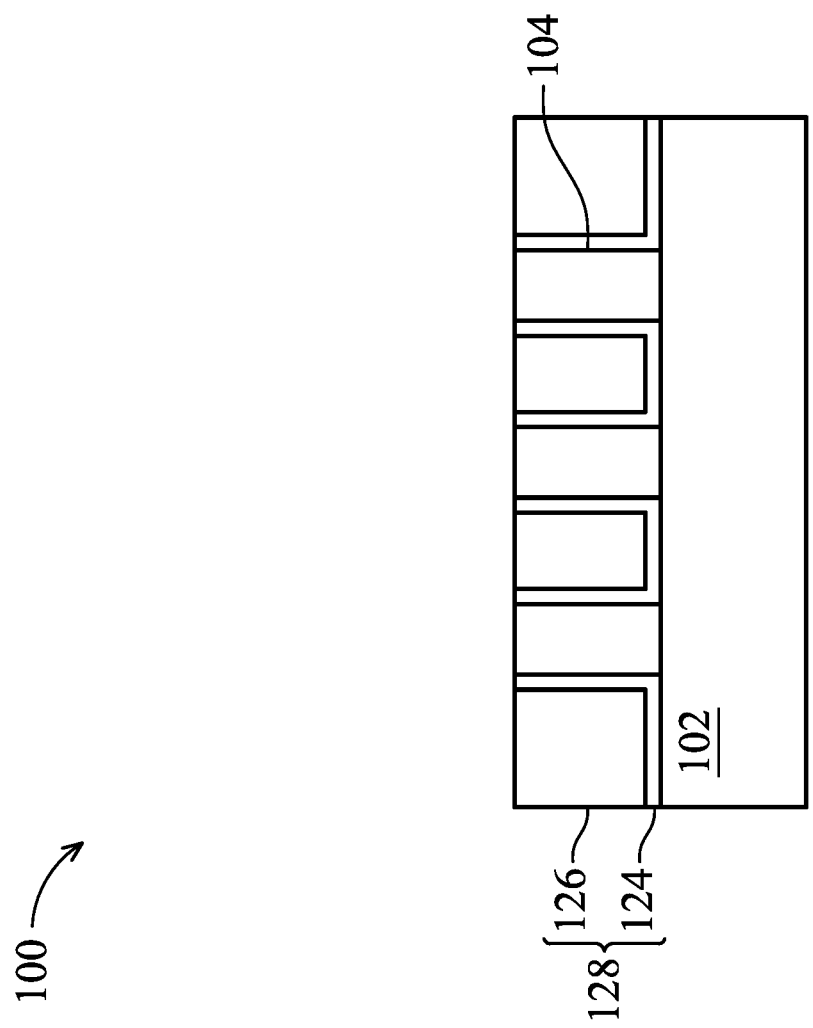

In FIG. 12, a planarization process is performed to level topmost surfaces of the liner 124 and the conductive material 126 with top surfaces of the target layer 104, forming the conductive features 128. The planarization process may be a CMP process, an etch-back process, combinations thereof, or the like. Thus, the conductive features 128, including the liner 124 and the conductive material 126, may be formed in the target layer 104.

In other embodiments, the deposition and planarization processes of FIGS. 11 and 12 may be excluded. For example, in some embodiments, the hard mask layer 108 and the dielectric layer 106 may be used to pattern the target layer 104, which is a semiconductor substrate. In such embodiments, the hard mask layer 108 and the dielectric layer 106 define a pattern for fins used in FinFET devices. In other embodiments, the hard mask layer 108 and the dielectric layer 106 may be used to pattern a blanket deposited layer (e.g. a conductive dummy gate layer). In such embodiments, the hard mask layer 108 and the dielectric layer 106 define a pattern of gate structures for transistors. Other features may also be patterned using the processes described above.

As described above, forming the hard mask 132 over the patterned upper layer 116 and patterning the middle layer 114 using the hard mask 132 as a masking layer allows the patterned upper layer 116 to be removed along with any remaining scum. The scum is thus removed without requiring an additional de-scum or trimming process, which avoids line bridging. This prevents scum and line bridging from causing defects in the patterning of the middle layer 114 and the underlying layers. For example, scum can cause shorts in a resulting device and line bridging can cause leakage, among other issues. The hard mask 132 further reduces device critical dimensions, reduces line width roughness, and increases the etching window. As a result, fine-pitched semiconductor structures may be formed with improved yield.

FIGS. 13-18 illustrate a second embodiment in which features having different widths are patterned in a target layer 104. Reference numerals used in FIGS. 13-18 which are the same as reference numerals used in FIGS. 1-12 indicate the same or similar layers and/or structures. As such, layers and structures having the same reference numerals may be formed using similar materials and methods as those discussed above with reference to FIGS. 1-12 and will not be repeated.

Figure 13:
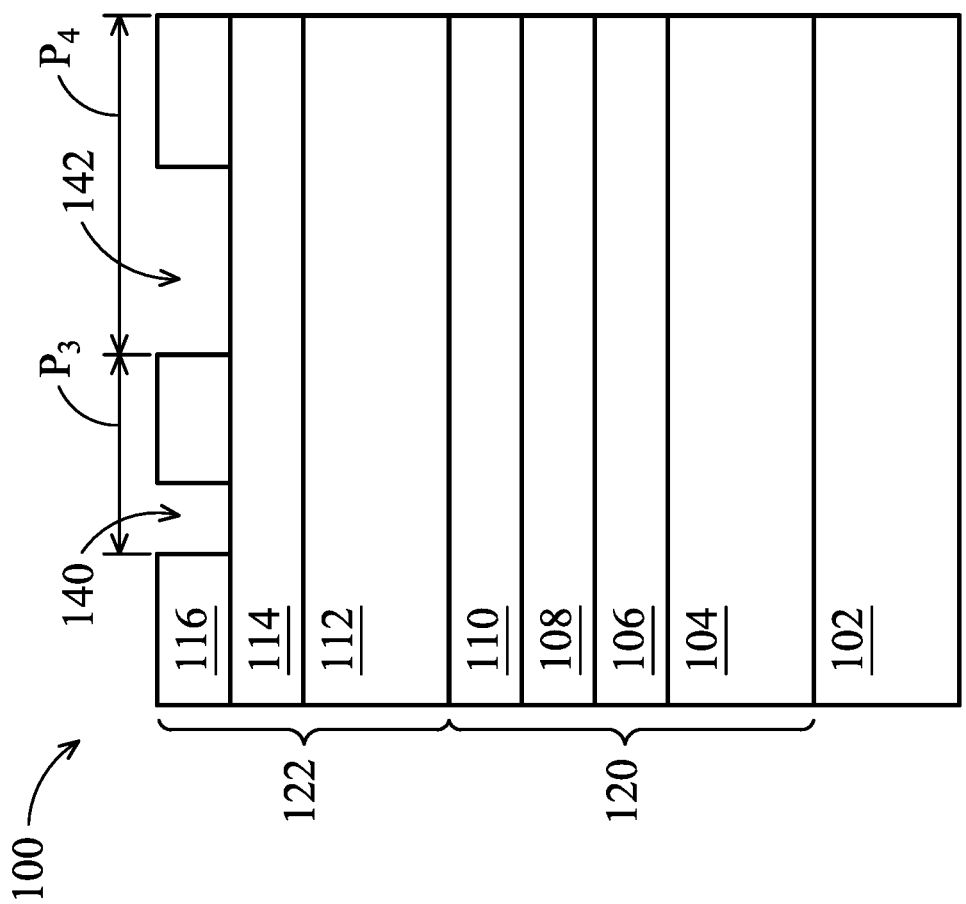
FIGS. 13 through 18 illustrate cross-sectional views of intermediary stages of manufacturing a semiconductor device in accordance with a second group of embodiments.

In FIG. 13, the upper layer 116 is patterned using a photolithographic process to form a first opening 140 and a second opening 142. The upper layer 116 may be patterned using any suitable photolithography process to form the first opening 140 and the second opening 142 therein. As an example of patterning the first opening 140 and the second opening 142 in the upper layer 116, a photomask may be disposed over the upper layer 116. The upper layer 116 may then be exposed to a radiation beam including an extreme ultraviolet (EUV) light source, an ultraviolet (UV) light source, an excimer laser such as a 248 nm beam from a krypton fluoride (KrF) excimer laser, a 193 nm beam from an argon fluoride (ArF) excimer laser, or a 157 nm beam from a $F_2$ excimer laser, or the like while the photomask masks areas of the upper layer 116. Exposure of the upper layer 116 may be performed using an immersion lithography system to increase the resolution and decrease the minimum achievable pitch. A bake or cure operation may be performed to harden the upper layer 116, and a developer may be used to remove either the exposed or unexposed portions of the upper layer 116, depending on whether a positive or negative resist is used. A pitch $P_3$ of the first openings 140 may be about 80 nm or less, about 28 nm or less, or even about 20 nm or less. Other pitches $P_3$ of the first openings 140 are also contemplated. The pitch $P_4$ of the second openings 142 may be from about 100 nm to about 500 nm. A ratio of the pitch $P_3$ to the pitch $P_4$ may be from about 0.04 to about 0.8, such as about 0.28. In some embodiments, the first openings 140 may have an aspect ratio of height to width from about 0.25 to about 6, such as about 3. A width of the first openings 140 may be from about 10 nm to about 40 nm, such as about 14 nm. The second openings 142 may have an aspect ratio of height to width from about 0.02 to about 0.6, such as about 0.1. A width of the openings 142 may be from about 50 nm to about 250 nm, such as about 125 nm.

Figure 14:
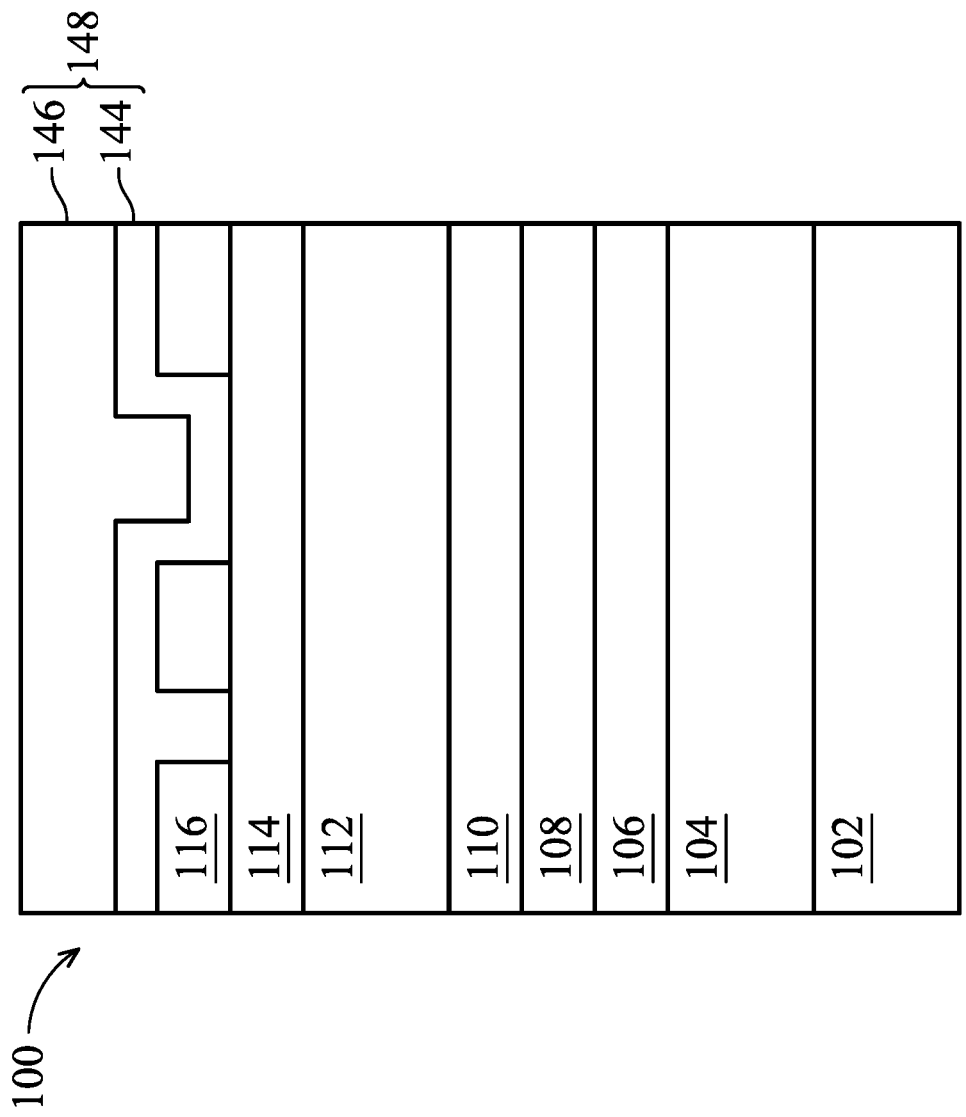

In FIG. 14, a hard mask 148 is deposited in the first opening 140, the second opening 142, and over the upper layer 116. As illustrated in FIG. 14, the hard mask 148 may include a first hard mask layer 144 and a second hard mask layer 146. The hard mask 148 (including the first hard mask layer 144 and the second hard mask layer 146) may be deposited over the tri-layer photoresist 122 by a deposition chamber, such that additional deposition tools or chambers are not required. The first hard mask layer 144 and the second hard mask layer 146 may be deposited using any suitable deposition process, such as atomic layer deposition (ALD), chemical vapor deposition (CVD), or the like.

In specific embodiments, the first hard mask layer 144 may be formed by ALD and the second hard mask layer 146 may be formed by CVD. In embodiments in which the first hard mask layer 144 is deposited by ALD, the first hard mask layer 144 may be deposited using a first precursor gas and a second precursor gas. The first precursor gas and the second precursor gas are introduced to a reaction chamber and react with the surface of the underlying material one at a time in a sequential, self-limiting manner. As a result, the first hard mask layer 144 is deposited monolayer-by-monolayer. In embodiments in which the second hard mask layer 146 is deposited by CVD, the second hard mask layer 146 may be deposited using a first precursor gas and a second precursor gas. The first precursor gas and the second precursor gas are introduced to a reaction chamber and react with the surface of the underlying material simultaneously. As a result, the second hard mask layer 146 deposited using CVD may be deposited more quickly than by using ALD.

The first hard mask layer 144 may be deposited in the first opening 140, the second opening 142, and over the upper layer 116. The first hard mask layer 144 may have a thickness from about 120 Å to about 500 Å, such as about 300 Å. The first hard mask layer 144 may be aluminum oxide ($AlO_x$), titanium oxide ($TiO_x$), zirconium oxide ($ZrO_x$), zinc oxide (ZnO), tin oxide ($SnO_x$), silicon nitride, silicon carbide, silicon carbon nitride, combinations or multiple layers thereof, or the like. In some embodiments, the first hard mask layer 144 may be deposited using a first precursor gas and a second precursor gas. The first precursor gas may include trimethylaluminum (TMA, $Al(CH_3)_3$), diethyl zinc (DEZ, $Zn(C_2H_5)_2$), tetrakis(dimethylamino)titanium (TDMAT, $Ti[(CH_3)_2N]_4$), titanium isopropoxide (TTIP, $Ti[(CH_3)_2OCH]_4$), titanium tetrachloride ($TiCl_4$), bis (tertiary-butyl-amino)silane (BTBAS, $[NH(C_4H_9)]_2SiH_2$), bis(diethylamino)silane (BDIS, $SiH_2[N(C_2H_5)_2]_2$), tris(dimethylamino)silane (3DMAS, $SiH[N(CH_3)_2]_3$), tetrakis(dimethylamido)zirconium (TDMAZ, $Zr[N(CH_3)_2]_4$), zirconium tetrachloride ($ZrCl_4$), tetrakis(dimethylamido)tin (TDMASn, $Sn[N(C_2H_5)_4]$), or the like. The second precursor gas may include an oxygen source (e.g., water ($H_2O$), oxygen ($O_2$), ozone ($O_3$), hydrogen peroxide ($H_2O_2$), nitrous oxide ($N_2O$), or the like), another reacting compound (e.g., nitrogen ($N_2$), ammonia ($NH_3$), or the like), combinations thereof, or the like.

The second hard mask layer 146 may be deposited over the first hard mask layer 144. The second hard mask layer 146 may fill portions of the first opening 140 and the second opening 142 which are not completely filled by the first hard mask layer 144 (such as a remaining portion of the second opening 142, illustrated in FIG. 13). The second hard mask layer 146 may have a thickness from about 500 Å to about 3000 Å, such as about 2000 Å. The second hard mask layer 146 may be aluminum oxide ($AlO_x$), titanium oxide ($TiO_x$), zirconium oxide ($ZrO_x$), zinc oxide (ZnO), tin oxide ($SnO_x$), silicon nitride, silicon carbide, silicon carbon nitride, combinations or multiple layers thereof, or the like. In some embodiments, the second hard mask layer 146 may be deposited using a first precursor gas and a second precursor gas. The first precursor gas may include aluminum chloride ($AlCl_3$), trimethylaluminum (TMA, $Al(CH_3)_3$), diethyl zinc (DEZ, $Zn(C_2H_5)_2$), tetrakis(dimethylamino)titanium (TDMAT, $Ti[(CH_3)_2N]_4$), titanium isopropoxide (TTIP, $Ti[(CH_3)_2OCH]_4$), titanium tetrachloride ($TiCl_4$), silane ($SiH_4$), tetraethyl orthosilicate (TEOS, $Si(OC_2H_5)_4$), dichlorosilane ($SiH_2Cl_2$), tetramethylsilane ($Si(CH_3)_4$), tetrakis (dimethylamido)zirconium (TDMAZ, $Zr[N(CH_3)_2]_4$), zirconium tetrachloride ($ZrCl_4$), tetrakis(dimethylamido)tin (TDMASn, $Sn[N(C_2H_5)_4]$), or the like. The second precursor gas may include an oxygen source (e.g., water ($H_2O$), oxygen ($O_2$), ozone ($O_3$), hydrogen peroxide ($H_2O_2$), nitrous oxide ($N_2O$), or the like), another reacting compound (e.g., nitrogen ($N_2$), ammonia ($NH_3$), or the like), combinations thereof, or the like. The second hard mask layer 146 may be formed of the same material or a different material from the first hard mask layer 144.

The first hard mask layer 144 and the second hard mask layer 146 may be deposited at a temperature of less than about 200° C., a temperature from about 50° C. to about 200° C., or the like. Depositing the first hard mask layer 144 and the second hard mask layer 146 at a low temperature, such as below about 200° C. may limit any damage or decomposition of the underlying upper layer 116.

Figure 15:
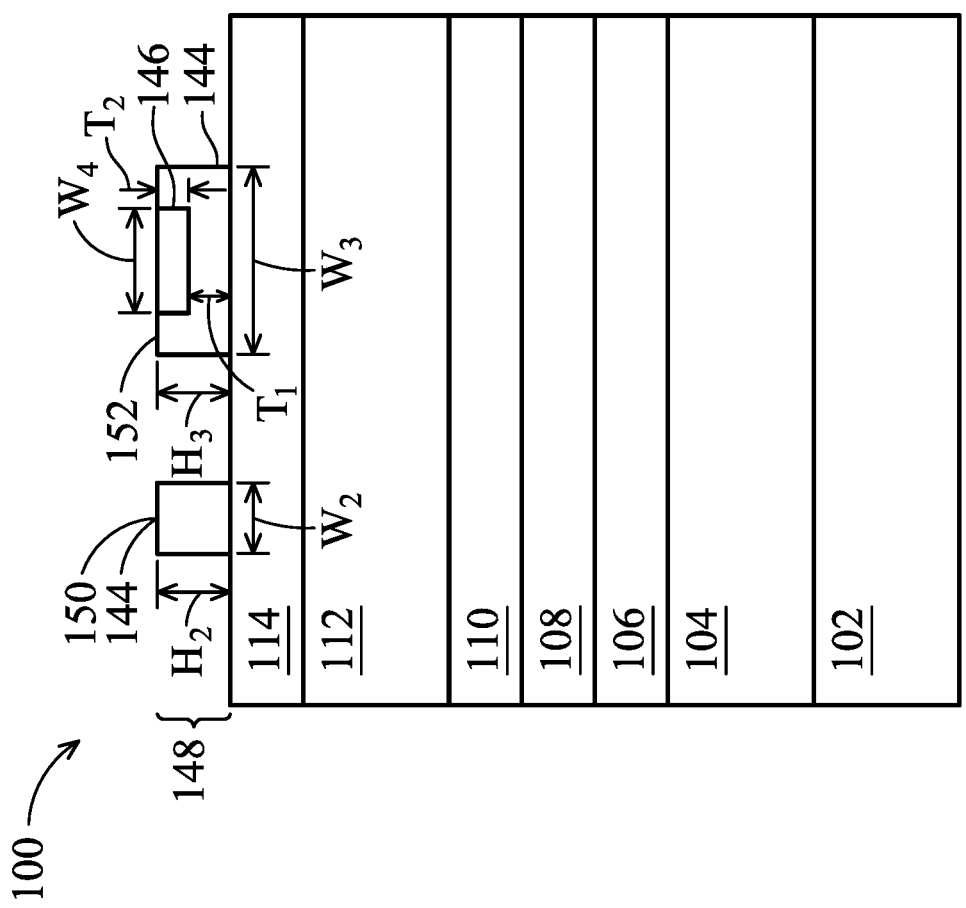

In FIG. 15, a planarization process is performed to remove portions of the hard mask 148, forming a first hard mask 150 and a second hard mask 152, and the upper layer 116 is removed. The planarization process may be a chemical mechanical polish (CMP), an etch-back process, combinations thereof, or the like. In some embodiments, the planarization process may result in top surfaces of the hard mask 148 being level with top surfaces of the upper layer 116. However, in further embodiments (e.g., embodiments in which an etch-back process or the like is used), the top surfaces of the hard mask 148 may be disposed above or below top surfaces of the upper layer 116. Moreover, as illustrated in FIG. 15, following the planarization process, upper surfaces of the first hard mask layer 144 may be level with upper surfaces of the second hard mask layer 146. The planarization process may be performed before removing the upper layer 116.

The upper layer 116 is then removed to form openings between the remaining portions of the hard mask 148. The upper layer 116 may be removed by using an acceptable ashing or stripping process, such as an oxygen plasma ashing, or the like. In some embodiments, the upper layer 116 may be removed by an etch process, such as an anisotropic etch process, an isotropic etch process, or the like. For example, the upper layer 116 may be removed by a wet etch process, a dry etch process, or the like. The upper layer 116 may be formed of a material having high etch selectivity to the hard mask 132 and the middle layer 114. As such, the upper layer is removed without removing the hard mask 132 and the middle layer 114.

As illustrated in FIG. 15, following the planarization process, the hard mask 148 includes a first hard mask 150 including the first hard mask layer 144 only and a second hard mask 152 including the first hard mask layer 144 and the second hard mask layer 146. The first hard mask 150 has a height $H_2$ from about 10 nm to about 60 nm, such as about 30 nm and a width $W_2$ from about 8 nm to about 38 nm, such as about 12 nm. The second hard mask 152 has a height $H_3$ from about 5 nm to about 50 nm, such as about 30 nm and a width $W_3$ from about 48 nm to about 248 nm, such as about 148 nm. The height $H_2$ may be the same as the height $H_3$. The portion of the first hard mask layer 144 included in the second hard mask 152 has a thickness $T_1$ from about 5 nm to about 24 nm, such as about 14 nm. The portion of the second hard mask layer 146 included in the second hard mask 152 has a thickness $T_2$ from about 5 nm to about 36 nm, such as about 30 nm and a width $W_4$ from about 38 nm to about 238 nm, such as about 138 nm.

The materials of the first hard mask layer 144 and the second hard mask layer 146 may have a higher etch selectivity relative to the material of the middle layer 114 than the material of the upper layer 116 has to the material of the middle layer 114. As such, the process used to remove the upper layer 116 may be carried out for a sufficient duration to remove scum (e.g., excess material remaining after patterning the upper layer 116), without damaging the hard mask 148, and without requiring an additional de-scum or trimming process. The additional de-scum or trimming processes may cause line bridging (caused by, e.g., excess material of the mask layer being etched). Forming the hard mask 148 over the upper layer 116 further aids in reducing device feature critical dimensions, reduces line width roughness, increases the etching window, and results in fewer defects in the middle layer 114. These improvements are carried through to a target layer (e.g., the target layer 104) and help to form fine-pitched semiconductor structures with improved yield.

Figure 16:
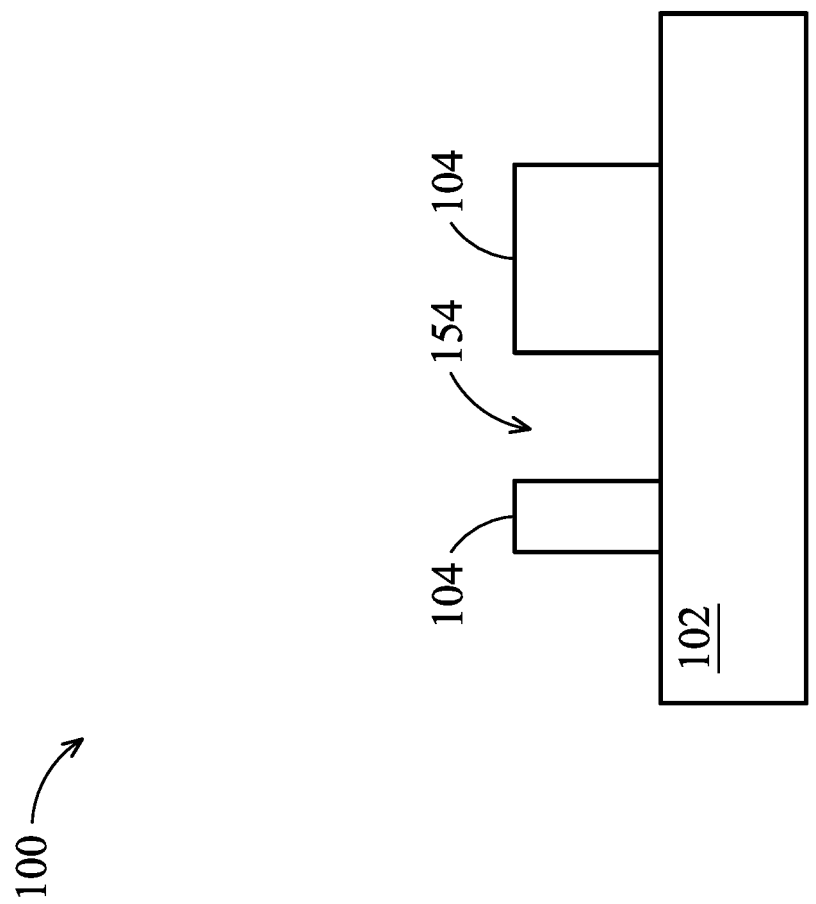

In FIG. 16, various etching processes are performed to transfer the pattern of the hard mask 148, illustrated in FIG. 15, through the underlying layers (e.g., the middle layer 114, the bottom layer 112, the dielectric layer 110, the hard mask layer 108, and the dielectric layer 106) to the target layer 104 and to form openings 154 in the patterned target layer 104. The etching processes used to etch the layers below the hard mask 148 may be the same as or similar to the etching processes described above with respect to FIGS. 5-10. The middle layer 114, the bottom layer 112, the dielectric layer 110, the hard mask layer 108, and the dielectric layer 106 may be consumed during the etching of underlying layers, or additional processes, such as wet cleaning processes, may be used to remove the middle layer 114, the bottom layer 112, the dielectric layer 110, the hard mask layer 108, and the dielectric layer 106.

Figure 17:
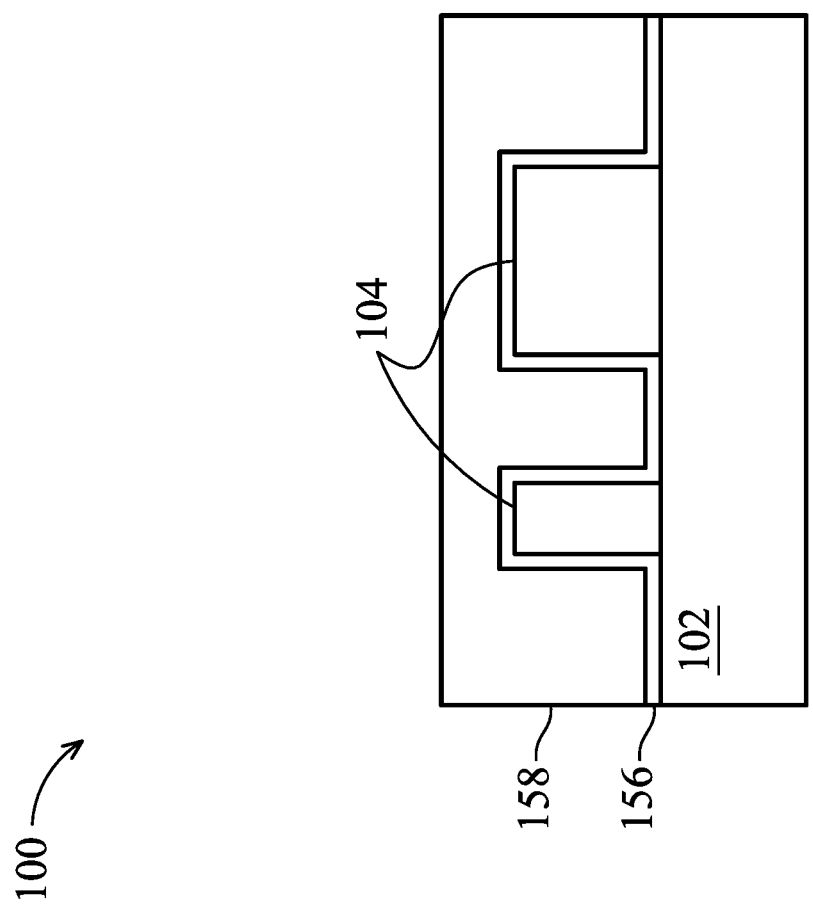

In FIG. 17, conductive features 160 (illustrated in FIG. 18) are formed by initially depositing a liner 156 and a conductive material 158 over the semiconductor substrate 102 and the target layer 104 and filling the openings 154. In an embodiment in which the target layer 104 is a low-k dielectric, the patterned target layer 104 provides an IMD for an interconnect structure. The liner 156 may include one or more layers deposited along sidewalls and a bottom surface of the openings 154 and along top surfaces of the target layer 104. The liner 156 may comprise TiO, TiN, TaO, TaN, multiple layers thereof, or the like and may provide a diffusion barrier, an adhesion layer, and/or seed layers for the conductive features 160. The liner 156 may be deposited using any suitable process, such as, PVD, CVD, ALD, or the like.

After the liner 156 is deposited, remaining portions of the openings 154 may be filled with a conductive material 158, such as copper. The conductive material 158 may be deposited using any suitable method, such as PVD, plating, or the like. As illustrated in FIG. 17, the conductive material 158 may be initially deposited to overfill the openings 154.

Figure 18:
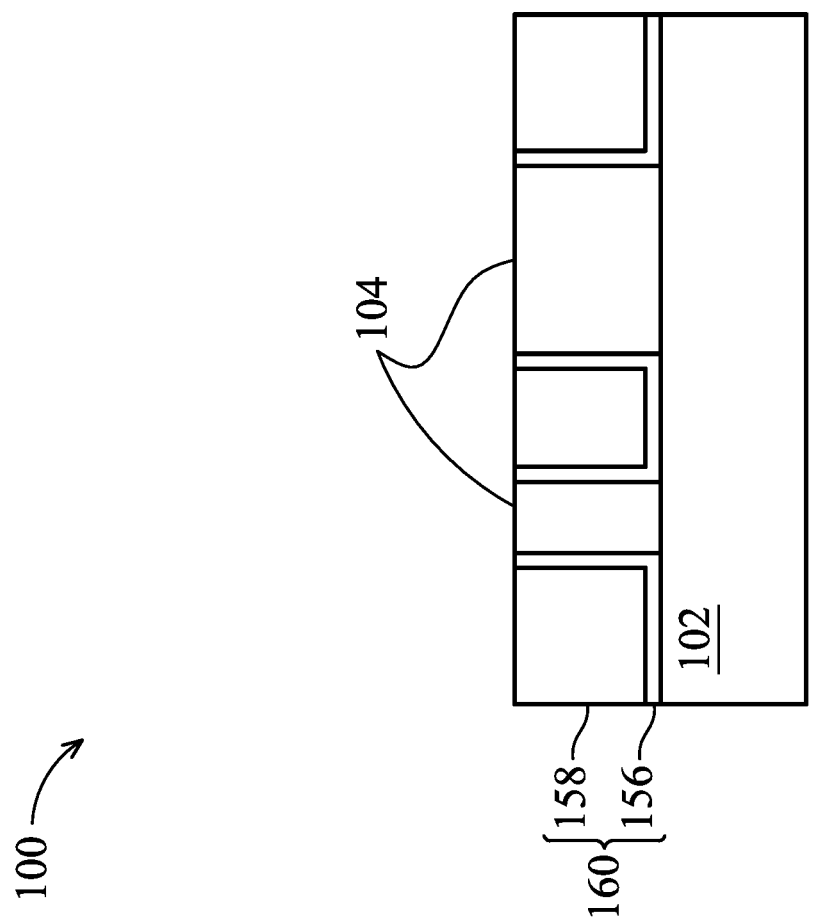

In FIG. 18, a planarization process is performed to level topmost surfaces of the liner 156 and the conductive material 158 with top surfaces of the target layer 104, forming the conductive features 160. The planarization process may be a CMP process, an etch-back process, combinations thereof, or the like. Thus, the conductive features 160, including the liner 156 and the conductive material 158, may be formed in the target layer 104.

In other embodiments, the deposition and planarization processes of FIGS. 17 and 18 may be excluded. For example, in some embodiments, the hard mask layer 108 and the dielectric layer 106 may be used to pattern the target layer 104, which is a semiconductor substrate. In such embodiments, the hard mask layer 108 and the dielectric layer 106 define a pattern for fins used in FinFET devices. In other embodiments, the hard mask layer 108 and the dielectric layer 106 may be used to pattern a blanket deposited layer (e.g. a conductive dummy gate layer). In such embodiments, the hard mask layer 108 and the dielectric layer 106 define a pattern of gate structures for transistors. Other features may also be patterned using the processes described above.

As described above, forming the hard mask 148 over the patterned upper layer 116 and patterning the middle layer 114 using the hard mask 148 as a masking layer allows the patterned upper layer 116 to be removed along with any remaining scum. The scum is thus removed without requiring an additional de-scum or trimming process, which avoids line bridging. This prevents scum and line bridging from causing defects in the patterning of the middle layer 114 and the underlying layers. For example, scum can cause shorts in a resulting device and line bridging can cause leakage, among other issues. Using the hard mask 148 allows for features having different widths to be patterned in the target layer 104. The hard mask 148 further reduces device critical dimensions, reduces line width roughness, and increases the etching window. As a result, fine-pitched semiconductor structures may be formed with improved yield.

In accordance with an embodiment, a method includes depositing a photoresist layer over a first hard mask layer; patterning the photoresist layer to form a plurality of openings in the photoresist layer; depositing a second hard mask layer over the photoresist layer, the second hard mask layer filling the plurality of openings, the second hard mask layer having a first etch selectivity relative to the first hard mask layer, the photoresist layer having a second etch selectivity relative to the first hard mask layer, the first etch selectivity being greater than the second etch selectivity; planarizing the second hard mask layer; removing the photoresist layer; and etching the first hard mask layer using the second hard mask layer as a mask. In an embodiment, the second hard mask layer includes at least one of aluminum oxide (AlOx), titanium oxide (TiOx), zirconium oxide (ZrOx), zinc oxide (ZnO), or tin oxide (SnOx). In an embodiment, a first precursor gas for depositing the second hard mask layer includes at least one of trimethylaluminum (TMA, Al(CH3)3), diethyl zinc (DEZ, Zn(C2H5)2), tetrakis(dimethylamino)titanium (TDMAT, Ti[(CH3)2N]4), titanium isopropoxide (TTIP, Ti[(CH3)2OCH]4), titanium tetrachloride (TiCl4), tetrakis(dimethylamido)zirconium (TDMAZ, Zr[N(CH3)2]4), zirconium tetrachloride (ZrCl4), or tetrakis(dimethylamido)tin (TDMASn, Sn[N(C2H5)4]). In an embodiment, a second precursor gas for depositing the second hard mask layer includes at least one of water (H2O), oxygen (O2), ozone (O3), hydrogen peroxide ($H_2O_2$), or nitrous oxide (N2O). In an embodiment, patterning the photoresist layer includes exposing the photoresist layer to an extreme ultraviolet (EUV) light source. In an embodiment, the photoresist layer has a thickness of less than about 60 nm. In an embodiment, the openings have a width from 10 nm to 40 nm.

In accordance with another embodiment, a method includes patterning a photoresist layer to form a first opening and a second opening in the photoresist layer; depositing a hard mask over the photoresist layer, the hard mask including a first hard mask layer and a second hard mask layer, the first hard mask layer filling the first opening and a first portion of the second opening, the second hard mask layer filling a remainder of the second opening; planarizing the hard mask; removing the photoresist layer; and patterning a target layer using the hard mask. In an embodiment, after planarizing the hard mask, upper surfaces of the first hard mask layer are level with upper surfaces of the second hard mask layer. In an embodiment, the first hard mask layer is deposited by atomic layer deposition and the second hard mask layer is deposited by chemical vapor deposition. In an embodiment, wherein after planarizing the hard mask, a portion of the hard mask deposited in the first opening has a height from 10 nm to 60 nm. In an embodiment, the first opening has a first width from 10 nm to 40 nm and the second opening has a second width from 50 nm to 250 nm. In an embodiment, the first hard mask layer has a thickness from 12 nm to 50 nm and the second hard mask layer has a thickness from 50 nm to 300 nm. In an embodiment, the first hard mask layer and the second hard mask layer include different materials.

In accordance with yet another embodiment, a method includes depositing a tri-layer photoresist over a film stack, the tri-layer photoresist including a bottom anti-reflective coating (BARC) layer, a first hard mask layer, and a photoresist layer; patterning the photoresist layer to form a plurality of openings in the photoresist layer, the patterning the photoresist layer including exposing the photoresist layer to a light source; depositing a second hard mask layer over the photoresist layer, the second hard mask layer being deposited at a temperature of less than 200° C.; planarizing the second hard mask layer; after planarizing the second hard mask layer, removing the photoresist layer; and patterning the first hard mask layer, the BARC layer, and the film stack using the second hard mask layer as a mask. In an embodiment, a first precursor gas for depositing the second hard mask layer includes at least one of bis(tertiary-butylamino)silane (BTBAS, [NH(C4H9)]2SiH2), bis(diethylamino)silane (BDIS, SiH2[N(C2H5)2]2), or tris(dimethylamino)silane (3DMAS, SiH[N(CH3)2]3). In an embodiment, a second precursor gas for depositing the second hard mask layer includes at least one of water (H2O), oxygen (O2), ozone (O3), hydrogen peroxide (H2O2), nitrous oxide (N2O), nitrogen (N2), or ammonia (NH3). In an embodiment, the second hard mask layer includes at least one of silicon nitride, silicon carbide, or silicon carbon nitride. In an embodiment, depositing the second hard mask layer includes depositing a first layer using atomic layer deposition. In an embodiment, depositing the second hard mask layer further includes depositing a second layer over the first layer using chemical vapor deposition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a photoresist layer over a first hard mask layer, wherein the photoresist layer is deposited in contact with the first hard mask layer;
   patterning the photoresist layer to form a plurality of openings in the photoresist layer;
   depositing a second hard mask layer over the photoresist layer, the second hard mask layer filling the plurality of openings, the second hard mask layer having a first etch selectivity relative to the first hard mask layer, the photoresist layer having a second etch selectivity relative to the first hard mask layer, the first etch selectivity being greater than the second etch selectivity, wherein the second hard mask layer is deposited in direct contact with the first hard mask layer;

planarizing the second hard mask layer;
removing the photoresist layer; and
etching the first hard mask layer using the second hard mask layer as a mask.

2. The method of claim 1, wherein the second hard mask layer comprises at least one of aluminum oxide ($AlO_x$), titanium oxide ($TiO_x$), zirconium oxide ($ZrO_x$), zinc oxide (ZnO), or tin oxide ($SnO_x$).

3. The method of claim 1, wherein a first precursor gas for depositing the second hard mask layer comprises at least one of trimethylaluminum (TMA, $Al(CH_3)_3$), diethyl zinc (DEZ, $Zn(C_2H_5)_2$), tetrakis(dimethylamino)titanium (TDMAT, $Ti[(CH_3)_2N]_4$), titanium isopropoxide (TTIP, $Ti[(CH_3)_2OCH]_4$), titanium tetrachloride ($TiCl_4$), tetrakis(dimethylamido)zirconium (TDMAZ, $Zr[N(CH_3)_2]_4$), zirconium tetrachloride ($ZrCl_4$), or tetrakis(dimethylamido)tin (TDMASn, $Sn[N(C_2H_5)_4]$).

4. The method of claim 3, wherein a second precursor gas for depositing the second hard mask layer comprises at least one of water ($H_2O$), oxygen ($O_2$), ozone ($O_3$), hydrogen peroxide ($H_2O_2$), or nitrous oxide ($N_2O$).

5. The method of claim 1, wherein patterning the photoresist layer comprises exposing the photoresist layer to an extreme ultraviolet (EUV) light source.

6. The method of claim 1, wherein the photoresist layer has a thickness of less than about 60 nm.

7. The method of claim 1, wherein the openings have a width from 10 nm to 40 nm.

8. A method comprising:
patterning a photoresist layer to form a first opening and a second opening in the photoresist layer;
depositing a hard mask over the photoresist layer, the hard mask comprising a first hard mask layer and a second hard mask layer, the first hard mask layer filling the first opening and a first portion of the second opening, the second hard mask layer filling a remainder of the second opening;
planarizing the hard mask, wherein after planarizing the hard mask a first height of the first hard mask layer in the first opening, a second height of the first hard mask layer in the second opening, and a third height of the first hard mask layer and the second hard mask layer in the second opening are equal to a height of the photoresist layer;
removing the photoresist layer; and
patterning a target layer using the hard mask.

9. The method of claim 8, wherein after planarizing the hard mask, upper surfaces of the first hard mask layer are level with upper surfaces of the second hard mask layer.

10. The method of claim 8, wherein the first hard mask layer is deposited by atomic layer deposition and the second hard mask layer is deposited by chemical vapor deposition.

11. The method of claim 8, wherein after planarizing the hard mask, a portion of the hard mask deposited in the first opening has a height from 10 nm to 60 nm.

12. The method of claim 8, wherein the first opening has a first width from 10 nm to 40 nm and the second opening has a second width from 50 nm to 250 nm.

13. The method of claim 8, wherein the first hard mask layer has a thickness from 12 nm to 50 nm and the second hard mask layer has a thickness from 50 nm to 300 nm.

14. The method of claim 8, wherein the first hard mask layer and the second hard mask layer comprise different materials.

15. A method comprising:
depositing a tri-layer photoresist over a film stack, the tri-layer photoresist comprising a bottom anti-reflective coating (BARC) layer, a first hard mask layer, and a photoresist layer;
patterning the photoresist layer to form a plurality of openings in the photoresist layer exposing top surfaces of the first hard mask layer, wherein patterning the photoresist layer comprises exposing the photoresist layer to a light source;
after patterning the photoresist layer, depositing a second hard mask layer over the photoresist layer, wherein the second hard mask layer is deposited at a temperature of less than 200° C.;
planarizing the second hard mask layer;
after planarizing the second hard mask layer, removing the photoresist layer; and
patterning the first hard mask layer, the BARC layer, and the film stack using the second hard mask layer as a mask.

16. The method of claim 15, wherein a first precursor gas for depositing the second hard mask layer comprises at least one of bis(tertiary-butyl-amino)silane (BTBAS, $[NH(C_4H_9)]_2SiH_2$), bis(diethylamino)silane (BDIS, $SiH_2[N(C_2H_5)_2]_2$), or tris(dimethylamino)silane (3DMAS, $SiH[N(CH_3)_2]_3$).

17. The method of claim 16, wherein a second precursor gas for depositing the second hard mask layer comprises at least one of water ($H_2O$), oxygen ($O_2$), ozone ($O_3$), hydrogen peroxide ($H_2O_2$), nitrous oxide ($N_2O$), nitrogen ($N_2$), or ammonia ($NH_3$).

18. The method of claim 15, wherein the second hard mask layer comprises at least one of silicon nitride, silicon carbide, or silicon carbon nitride.

19. The method of claim 15, wherein depositing the second hard mask layer comprises depositing a first layer using atomic layer deposition.

20. The method of claim 19, wherein depositing the second hard mask layer further comprises depositing a second layer over the first layer using chemical vapor deposition.

* * * * *